United States Patent
Weaver et al.

(10) Patent No.: US 6,409,898 B1
(45) Date of Patent: Jun. 25, 2002

(54) COOLING SYSTEM FOR CATHODIC ARC CATHODES

(75) Inventors: Scott Andrew Weaver, Ballston Lake; Don Mark Lipkin; Reed Roeder Corderman, both of Niskayuna, all of NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/681,386

(22) Filed: Mar. 28, 2001

(51) Int. Cl.[7] .................. C25B 11/02; C23C 14/34
(52) U.S. Cl. ................. 204/298.41; 204/298.12; 204/298.09
(58) Field of Search ............. 204/298.41, 298.09, 204/298.12, 298.08

(56) References Cited

U.S. PATENT DOCUMENTS 4,673,477 A * 6/1987 Ramalingam et al. . 204/192.38
5,580,429 A * 12/1996 Chan et al. ............ 204/192.38
5,985,115 A * 11/1999 Hartsough et al. ..... 204/298.09

* cited by examiner

Primary Examiner—Steven H. VerSteeg
(74) Attorney, Agent, or Firm—Robert P. Santandrea; Noreen C. Johnson

(57) ABSTRACT

An apparatus for cathodic arc coating is provided. The apparatus includes: a vacuum chamber which includes an anode; a power supply; and a cathode target connected to the power supply. The cathode target has a channeled back surface for improving heat transfer from the cathode target. In the preferred embodiment, the cathode target also includes a conductor segment connecting the cathode target to the power supply of the cathodic arc coating apparatus for conducting the increased current capacity of the cathode target and a cooling block in contact with the cathode target to further improve the heat transfer from the cathode target.

25 Claims, 5 Drawing Sheets

COOLING SYSTEM FOR CATHODIC ARC CATHODES

BACKGROUND OF INVENTION

The present invention relates generally to cathodic arc coating and, more particularly, to an improved cooling system for cathodic arc cathodes.

The cathodic arc process is known in the art as a robust, relatively inexpensive technique for deposition of single and multi-component metallic and nonmetallic coatings. Cathodic arc deposition systems consist of a vacuum chamber which include an anode, a power supply and a cathode. The cathode material is deposited during the operation of the system.

Due to the large arc power needed for deposition, the heat generated must be removed from the cathode to prevent melting or other undesirable effects. In known cathodic arc source designs, the cathode is mounted to a cooling block in which water flows over the back surface of the cathode. However, at high currents the cathode may still overheat. Not only may an expensive sample be damaged but also a coolant failure may result in water flash vaporizing into the vacuum chamber, which may damage the entire coating apparatus and vacuum pump. In addition, the cooling system must be capable of, carrying the increased current load.

Thus, there remains a need for an improved cathodic arc coating apparatus which is able to handle the temperature created by much higher currents while, at the same time, providing sufficient electrical contact to conduct these high currents.

SUMMARY OF INVENTION

The present invention is directed to an apparatus for cathodic arc coating. The apparatus includes: a vacuum chamber which includes: an anode; a power supply; and a cathode target assembly connected to the power supply. The cathode target assembly has a channeled back surface for improving heat transfer from the cathode target.

In the preferred embodiment, the cathode target also includes a conductor segment connecting the cathode target to the power supply of the cathodic arc coating apparatus for conducting the increased current capacity of the cathode and a cooling block in contact with the cathode to further improve the heat transfer from the cathode target.

The cooling block includes a chamber adjacent to the cathode and a cooling fluid supply contained within the chamber. A fluid seal between the cooling block and the cathode prevents leakage of coolant into the vacuum chamber. The cooling fluid supply includes an inlet for providing cooling fluid into the chamber and an exit for withdrawing the fluid from the chamber.

The vacuum chamber includes an enclosed chamber and a staged pump for producing a vacuum therein. In the preferred embodiment, the power supply is a continuous DC power supply of greater than about 60 amps at about 20 volts.

In the preferred embodiment, the channeled back surface of the cathode target is continuous and annular. In addition, the cross-sectioned area of the conductor segment is sufficient to conduct at least 1 amp/cm$^2$.

Accordingly, one aspect of the present invention is to provide an apparatus for cathodic arc coating. The apparatus includes: a vacuum chamber which includes an anode; a power supply; and a cathode target assembly located within the vacuum chamber and connected to the power supply, and having a channeled back surface for improving heat transfer from the cathode target.

Another aspect of the present invention is to provide an improved cathode target assembly for a cathodic arc coating apparatus. The cathode target assembly includes: a cathode target having a channeled back surface for improving heat transfer from the cathode target; and a conductor segment connecting the cathode target to the power supply of the cathodic arc coating apparatus.

Still another aspect of the present invention is to provide an apparatus for cathodic arc coating. The apparatus includes: a vacuum chamber which includes: an anode; a power supply; a cathode target assembly located within the vacuum chamber and connected to the power supply, and having a channeled back surface for improving heat transfer from the cathode target and a conductor segment connecting the cathode target to the power supply of the cathodic arc coating apparatus; and a cooling block in contact with the cathode target.

These and other aspects of the present invention will become apparent to those skilled in the art after a reading of the following description of the preferred embodiment when considered with the drawings.

DETAILED DESCRIPTION

Figure 1:
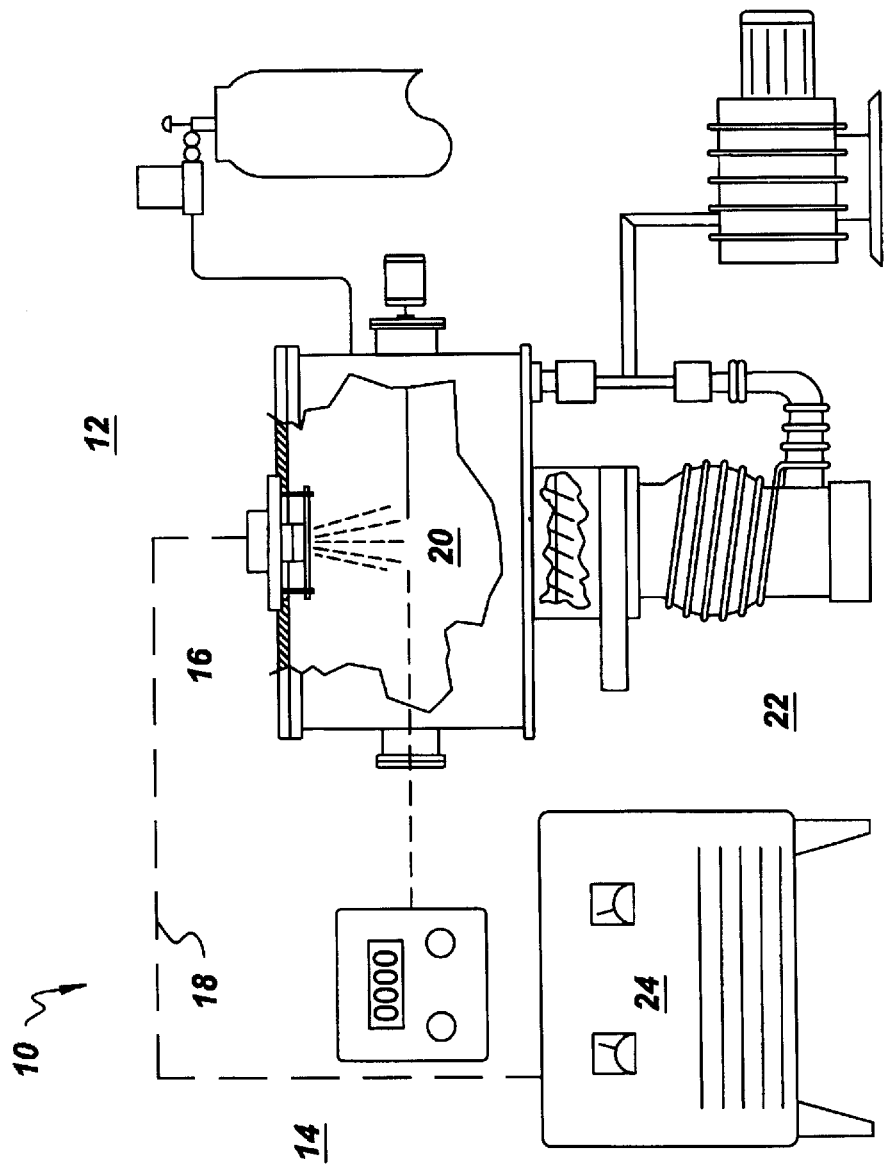
FIG. 1 is a schematic representation of a cathodic arc coating apparatus constructed according to the present invention.

In the following description, like reference characters designate like or corresponding parts throughout the several views. Also in the following description, it is to be understood that such terms as "forward," "rearward," "left," "right," "upwardly," "downwardly," and the like are words of convenience and are not to be construed as limiting terms.

Turning to the figures in general, and FIG. 1 in particular, there is shown a cathodic arc coating apparatus, generally designated 10, constructed according to the present invention. The apparatus includes three primary assemblies: a vacuum system 12 which includes: an anode; a power supply 14; and a channeled cathode assembly 16.

The vacuum system 12 includes an enclosed chamber 20 and a staged pump system 22 for removing the atmosphere from the enclosed chamber 20. In the preferred embodiment, the power supply 14 is a DC power supply 24, such as a Model MA200, including a restart circuit, available from Ion Bond of Madison Heights, Mich. In the preferred embodiment, this is a continuous DC power supply capable of producing greater than 60 amps at about 20 volts for a total power output greater than about 1200 watts at a 100% duty cycle.

As in conventional cathodic arc coating systems, a bias voltage is connected to the parts to be coated through the chamber wall. The parts may be rotated by means of a planetary drive motor to be sure that the parts are uniformly coated. The vacuum chamber staged pump system 22 is also of generally conventional design, including a throttle valve and gate valve to allow the chamber 20 to be isolated from a diffusion pump and a rough pump. downstream from of the diffusion pump. A chamber rough valve and a foreline valve allow the chamber to be evacuated before the diffusion pump is engaged. A process gas supply may also be used to partially backfill the chamber with an inert or selectively reactive gas.

Figure 2:
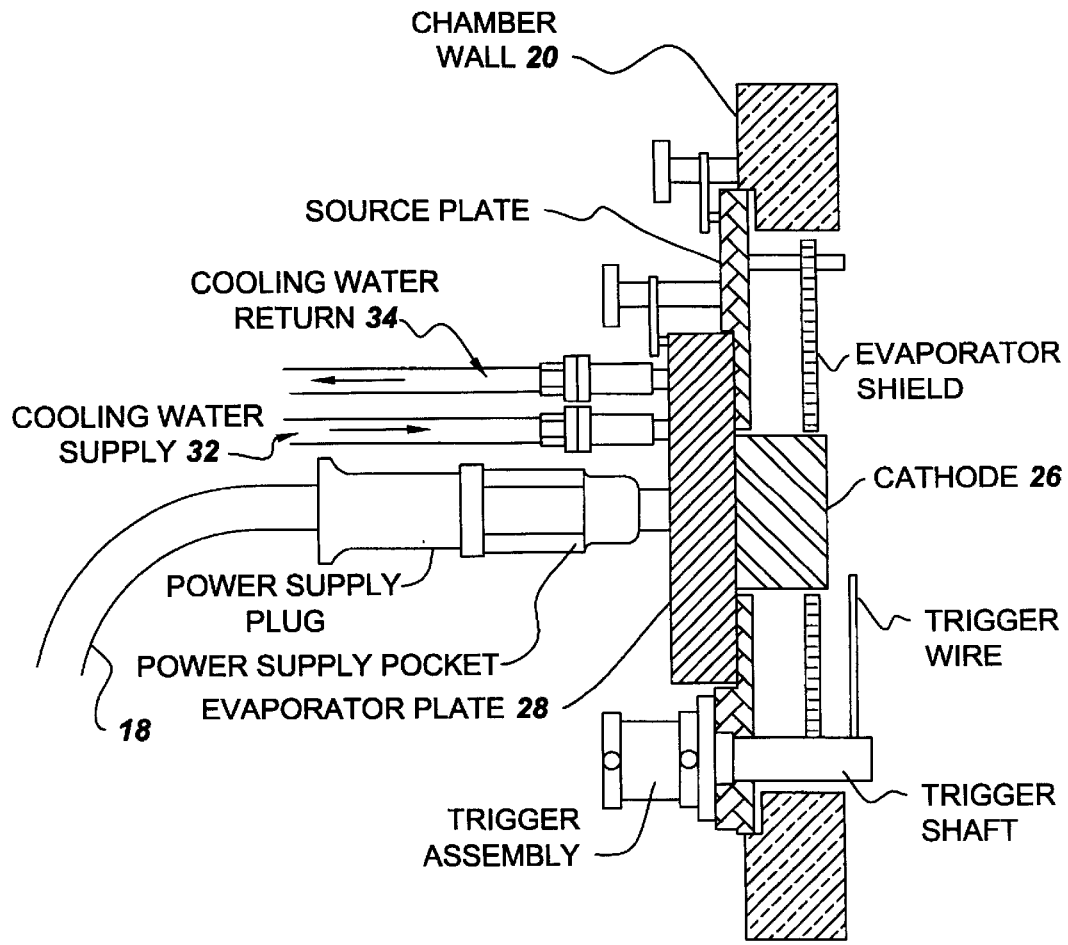
FIG. 2 is an enlarged cross-sectional view of the cathode assembly shown in FIG. 1.

Turning now to FIG. 2, there is shown an enlarged cross-sectional view of the cathode assembly 16 shown in FIG. 1. As can be seen, the cathode target 26 is attached to a cooling block 28 through which power supply 18 is fed into the cathode target 26. In addition, in the preferred embodiment, the cooling block 28 has a supply of cooling fluid, such as water, through inlet 32, which then returns the cooling water through outlet 34. This entire assembly is attached to the top wall of chamber 20.

Figure 3:
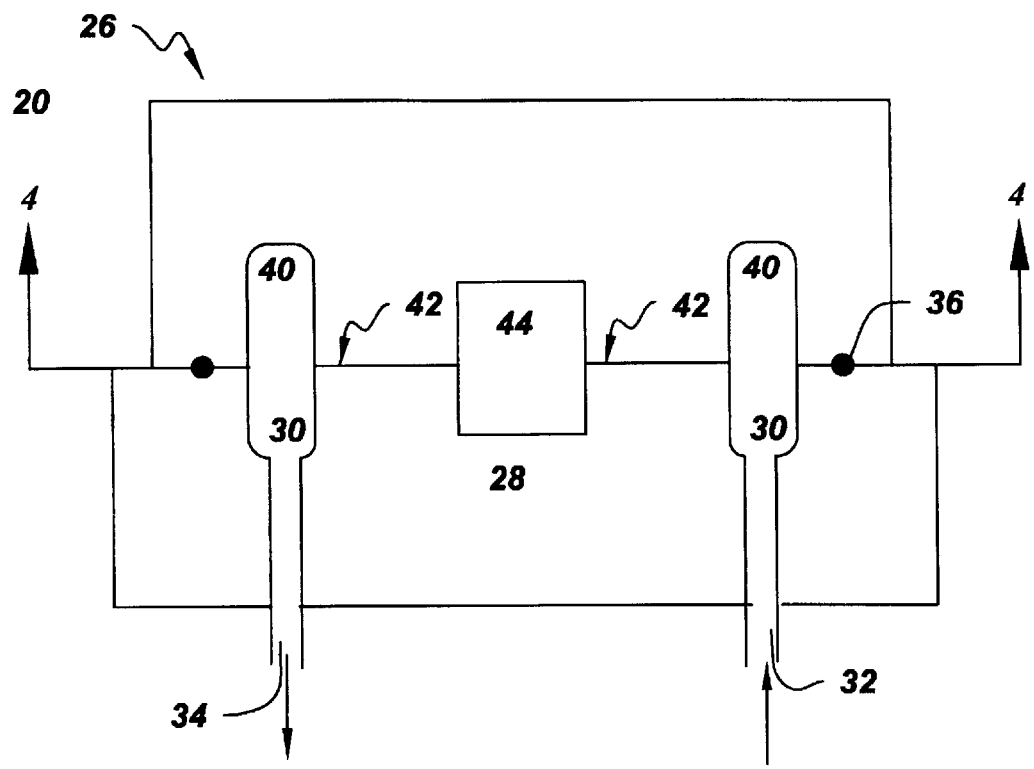
FIG. 3 is a cross-sectional schematic view of the cooling block sub-assembly of the present invention.

The preferred embodiment of the present invention can best be seen in FIG. 3, which is a cross-sectional schematic view of the cooling block 28 and the channeled cathode assembly 16. As will be appreciated, for a given power input, the deposition rate from the cathode target 26 will be relatively constant over time. However, being able to increase power input from, for example, 1 KW to 2 KW, results in a significant increase in the transfer rate of material to the work piece. Excessive temperature buildup can either melt the target or change the quality of material being deposited on the work piece. Accordingly, it is very important to be able to control the temperatures of both the cathode target surface and the work piece.

In the preferred embodiment, a conventional cooling block 28 is used in contact with the channeled cathode assembly 16. This cooling block includes a fluid chamber 30 adjacent to the back wall of the cathode target 26 for receiving the cooling fluid supply. In the preferred embodiment, the coolant is water, which is fed through inlet 32 and out of exit 34. However, in some situations, a molten salt, gas, or similar high heat capacity or high heat conductivity material could be used within this chamber.

When a liquid such as water is used, it is important that a seal, such as O-ring 36 be between two chambers to prevent the cooling fluid from flash vaporizing into the vacuum chamber, which could compromise the quality of the coating and may result in destruction of the downstream diffusion pump.

In the present invention, the chambers from the cooling block are preferably extending into the portion of the cathode assembly along a channeled chamber 40, which is coextensive along with the chamber 30 in the cooling block 28. As can be seen, this results in a substantial increase in the surface area where the cooling fluid is contacting the cathode target 26. Such an increase in cooling capacity allows a significant amount of energy, up to greater than about 1200 watts, to be added. However, in order to be able,.to absorb this amount of power and to conduct it to the cathode target 26, a portion of the cathode target 26 is left as a conductor segment 42. The cross sectional area of the conductor segment 42 is sufficient to conduct a current of at least about 1 amp/cm$^2$, and provides a power flux density of about 1000 watts per cm$^2$. In the preferred embodiment, a stud 44 is attached to one of the cooling block 28 or the cathode target 26, which allows the cathode target 26 to be securely attached to the cooling block and improves conduction of both heat and power.

Figure 4:
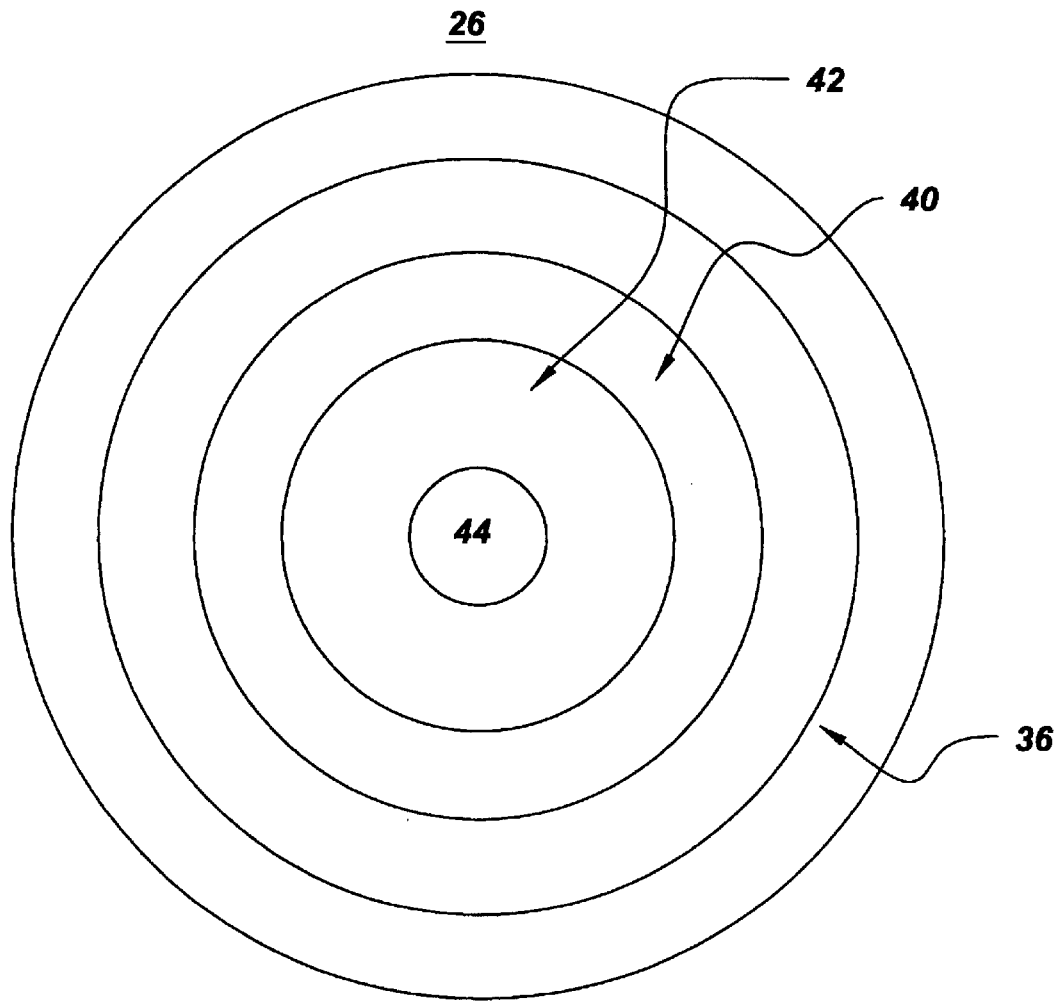
FIG. 4 is a cross-sectional view of the cathode assembly shown in FIG. 3 taken along lines 4—4.
Figure 5:
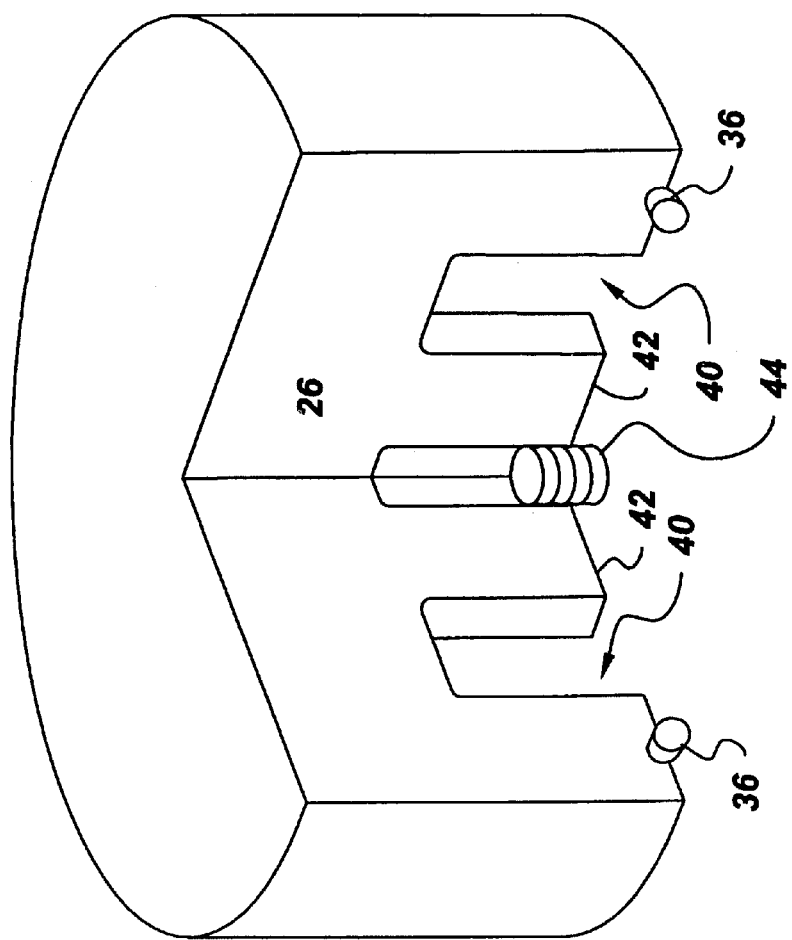
FIG. 5 is a perspective view of the channeled cathode assembly of the present invention with a quarter-section removed for illustration purposes.

As best seen in FIG. 4, because of the annular and symmetrical arrangement about the center conductor segment 42 and the stud 44 in the preferred embodiment, the cathode target 26 does not have to be set to just one position but can be tightened to whatever location is necessary without resulting in potentially catastrophic leakage of the cooling fluid into the chamber 20. This may be illustrated even further by FIG. 5, which shows a perspective view of the channeled cathode assembly 16 of the present invention with a quarter-section removed for illustration.

Certain modifications and improvements will occur to those skilled in the art upon a reading of the foregoing description. By way of example, while the preferred embodiment is a single symmetrical cooling channel because of reduced machining and adjustment requirements, multiple channels, labyrinths and surface treatments could be used to increase the surface area where additional cooling capacity may be needed. Also, a high heat capacity gas, such as helium could be used instead of a liquid cooling medium. It should be understood that all such modifications and improvements have been deleted herein for the sake of conciseness and readability but are properly within the scope of the following claims.

What is claimed is:

1. An apparatus for cathodic arc coating, said apparatus comprising:
    (a) a vacuum chamber which includes an anode;
    (b) a power supply;
    (c) a cathode target assembly located within said vacuum chamber and connected to said power supply, and having a channeled back surface for improving heat transfer from a cathode target;
    (d) a cooling block in contact with said cathode target, wherein said cooling block includes a chamber adjacent to said cathode target and a cooling fluid supply contained within said chamber, and
    (e) a fluid seal between said cooling block and said cathode target.

2. The apparatus according to clam 1, wherein said cooling fluid supply is water.

3. The apparatus according to claim 1, wherein said cooling block includes an inlet for providing a cooling fluid into said chamber and an exit for withdrawing the fluid from said chamber.

4. The apparatus according to claim 1, wherein said vacuum chamber includes an enclosed chamber and a staged pump for producing a vacuum therein.

5. The apparatus according to claim 1, wherein said power supply is a DC power supply.

6. The apparatus according to claim 5, wherein said DC power supply is a continuous DC power supply.

7. The apparatus according to claim 6, wherein said continuous DC power supply is capable of providing a current greater than about 60 amps at a DC voltage of about 20 volts.

8. An improved cathode target assembly for a cathodic arc coating apparatus having a power supply, said cathode target assembly comprising:
    (a) a cathode target having a channeled back surface for improving heat transfer from the cathode target; and
    (b) a conductor segment connecting said cathode target to the power supply of said cathodic arc coating apparatus.

9. The cathode target assembly according to claim 8, wherein said channeled back surface is continuous.

10. The cathode target assembly according to claim 8, wherein said channeled back surface comprises a continuous channel disposed in said back surface, and wherein said continuous channel is annular.

11. The cathode target assembly according to claim 8, wherein the cross sectional area of said conductor segment is sufficient to conduct a current of at least about 1 amp/cm$^2$.

12. The cathode target assembly according to claim 11, wherein said conductor segment provides a power flux density of about 1000 watts per cm$^2$.

13. An apparatus for cathodic arc coating, said apparatus comprising:

(a) a vacuum chamber which includes an anode;

(b) a power supply;

(c) a cathode target assembly located within said vacuum chamber and connected to said power supply, said cathode target assembly comprising a cathode target having a channeled back surface for improving heat transfer from said cathode target and a conductor segment connecting said cathode target to the power supply of said cathodic arc coating apparatus; and (d) a cooling block in contact with said cathode target.

14. The apparatus according to claim 13, wherein said cooling block includes a chamber adjacent to said cathode target and a cooling fluid supply contained within said chamber.

15. The apparatus according to claim 1 further including a fluid seal between said cooling block and said cathode target.

16. The apparatus according to claim 14, wherein said cooling fluid supply is water.

17. The apparatus according to claim 14, wherein said cooling block includes an inlet for providing a cooling fluid into said chamber and an exit for withdrawing the fluid from said chamber.

18. The apparatus according to claim 13, wherein said vacuum chamber includes an enclosed chamber and a staged pump for producing a vacuum therein.

19. The apparatus according to claim 13, wherein said power supply is a DC power supply.

20. The apparatus according to claim 19, wherein said DC power supply is a continuous DC power supply.

21. The apparatus according to claim 20, wherein said continuous DC power supply is capable of providing a current greater than about 60 amps at a DC voltage of about 20 volts.

22. The apparatus according to claim 13, wherein said channeled back surface is continuous.

23. The apparatus according to claim 13, wherein said channeled back surface comprises a continuous channel disposed in said back surface, and wherein said continuous channel is annular.

24. The apparatus according to claim 13, wherein the cross sectional area of said conductor segment is sufficient to conduct a current of at least about 1 amp/cm$^2$.

25. The apparatus according to claim 24, wherein said conductor segment provides a power flux density of about 1000 watts per cm$^2$.

* * * * *